United States Patent
Harvey

[19]

[11] Patent Number: 6,094,053
[45] Date of Patent: Jul. 25, 2000

[54] METHOD AND APPARATUS FOR IDENTIFYING ELECTRONIC CIRCUITS IN A DISTRIBUTED ELECTRONIC SYSTEM

[75] Inventor: Thomas Patrick Harvey, Novi, Mich.

[73] Assignee: Ford Global Technologies, Inc., Dearborn, Mich.

[21] Appl. No.: 08/554,026

[22] Filed: Nov. 6, 1995

[51] Int. Cl.$^7$ ...................................... H02J 7/00
[52] U.S. Cl. ......................... 324/434; 324/426; 340/518; 340/636; 320/15
[58] Field of Search ..................... 324/426, 427, 324/433, 434; 320/30, 39, 48, 49, 15; 340/636, 518, 825.06, 825.07, 82.21; 395/828, 829, 750

[56] References Cited

U.S. PATENT DOCUMENTS

| | | | |
|---|---|---|---|
| 4,360,870 | 11/1982 | McVey | 395/829 |
| 4,484,140 | 11/1984 | Dieu | 320/20 X |
| 4,775,931 | 10/1988 | Dickie et al. | 395/829 |
| 5,107,191 | 4/1992 | Lowndes et al. | 320/48 X |
| 5,206,578 | 4/1993 | Nor | 320/48 X |
| 5,237,257 | 8/1993 | Johnson et al. | 320/48 X |
| 5,350,995 | 9/1994 | Iketani | 324/434 |
| 5,365,160 | 11/1994 | Leppo et al. | 320/39 X |
| 5,551,053 | 8/1996 | Nadolski et al. | 395/829 |

OTHER PUBLICATIONS

Mirabor Designs "ModularBattery Charging System" (undated).
Delco Remy/AutoEnvironment "SmartGuard" (undated).

*Primary Examiner*—Josie Ballato
*Assistant Examiner*—Jose M. Solis
*Attorney, Agent, or Firm*—Mark S. Sparschu

[57] ABSTRACT

In one embodiment of the present invention, a distributed electronic system includes a plurality of electronic modules. Each of the electronic modules is coupled to one battery in a series connection of batteries. The electronic modules are coupled to a central controller via a data bus. Addresses are assigned to the electronic modules based on the potentials of corresponding nodes within the modules.

8 Claims, 2 Drawing Sheets

METHOD AND APPARATUS FOR IDENTIFYING ELECTRONIC CIRCUITS IN A DISTRIBUTED ELECTRONIC SYSTEM

BACKGROUND OF THE INVENTION

1. Field of the Invention

The present invention relates to distributed electronic systems.

2. Description of the Related Art

In a distributed electronic system, a number of electronic modules are decentralized, rather than a single integrated module being employed. An example of such a distributed electronic system is provided in my co-pending U.S. Pat. No. 5,760,587, filed Jun. 28, 1995. This system is a system for measuring the voltages of the series-connected "traction batteries" of an electric vehicle. These batteries provide the electric power for propulsion of the vehicle.

The distributed system in that disclosure has a plurality of battery measurement modules equal in number to the number of traction batteries. One of the battery measurement modules is connected across each of the batteries. The battery measurement modules are coupled to each other and to a central controller via a data bus. The central controller collects and analyzes battery voltage data from the various battery measurement modules. Such a distributed battery measurement system has considerable advantages over a centralized battery measurement system, in which one battery measurement module is coupled to all of the batteries.

In employing such a distributed electronic system, it is important for the central controller to be able to distinguish among the various battery measurement modules. This ability is needed so the central controller knows which battery measurement modules have sent the various data received by the central controller on the data bus. The central controller may also wish to transmit a command to a specific battery measurement module via the data bus.

One way that the battery measurement modules can be distinguished is by assigning each battery measurement module to be installed in a vehicle an address prior to installation of the module into the vehicle. This can be done (for example) in the battery measurement module's manufacturing facility, where for a vehicle having 28 batteries, battery measurement modules could be assigned addresses from one to 28. A battery measurement module's assigned address would be carried in that module's non-volatile memory for the life of the module. Although this method can work, it has substantial complications. Specifically, after the assignment of different addresses, the modules are no longer identical. Thus, the facility which manufactures the modules must keep track of the assigned addresses of each module, as must the facility which assembles the vehicles containing the modules. Battery measurement modules with duplicate addresses cannot be accommodated on the same vehicle. As an electric vehicle can have dozens of batteries, keeping track of dozens of unique battery measurement modules can be a substantial task. This task can add cost, complexity and errors in the production of an electric vehicle.

Therefore, a more efficient method for assigning addresses to electronic modules in a distributed electronic system will provide advantages over the prior art.

SUMMARY OF THE INVENTION

The present invention provides a method for identifying electronic circuits. The method comprises segregating the circuits into a plurality of groups, an electronic circuit placed in a group based on a potential at a node within that electronic circuit.

The present invention provides a second method for identifying electronic circuits, each electronic circuit having inputs coupled between positive and negative terminals of a battery, the batteries further coupled in series. The method comprises including a current-dependent voltage source within each electronic circuit, each voltage source having an output. The method also includes simultaneously coupling each voltage source output to a common node and measuring a voltage at each voltage source output. Also, the method comprises segregating the electronic circuits into at least two groups, the groups defined by the measured voltages. Further, the method includes assigning a common address to all electronic circuits within each group.

The present invention also provides a distributed electronic system comprising a plurality of batteries coupled in series and a plurality of electronic circuits, each electronic circuit coupled across a battery. The system also includes means for providing a voltage at a measurement node within each electronic circuit and means for switchably coupling each measurement node to a common point. Additionally, the system comprises means in electrical communication with the measurement nodes for measuring voltages at the measurement nodes. In addition, the system contains means for segregating a subset of the electronic circuits into at least two groups, each group defined by voltages measured by the measuring means when the switchable coupling means couple the measurement nodes of the subset of electronic circuits together.

The present invention improves the efficiency with which addresses are assigned in a distributed electronic system. In doing so, the present invention provides advantages over the prior art.

DETAILED DESCRIPTION OF THE PREFERRED EMBODIMENT

Figure 1:
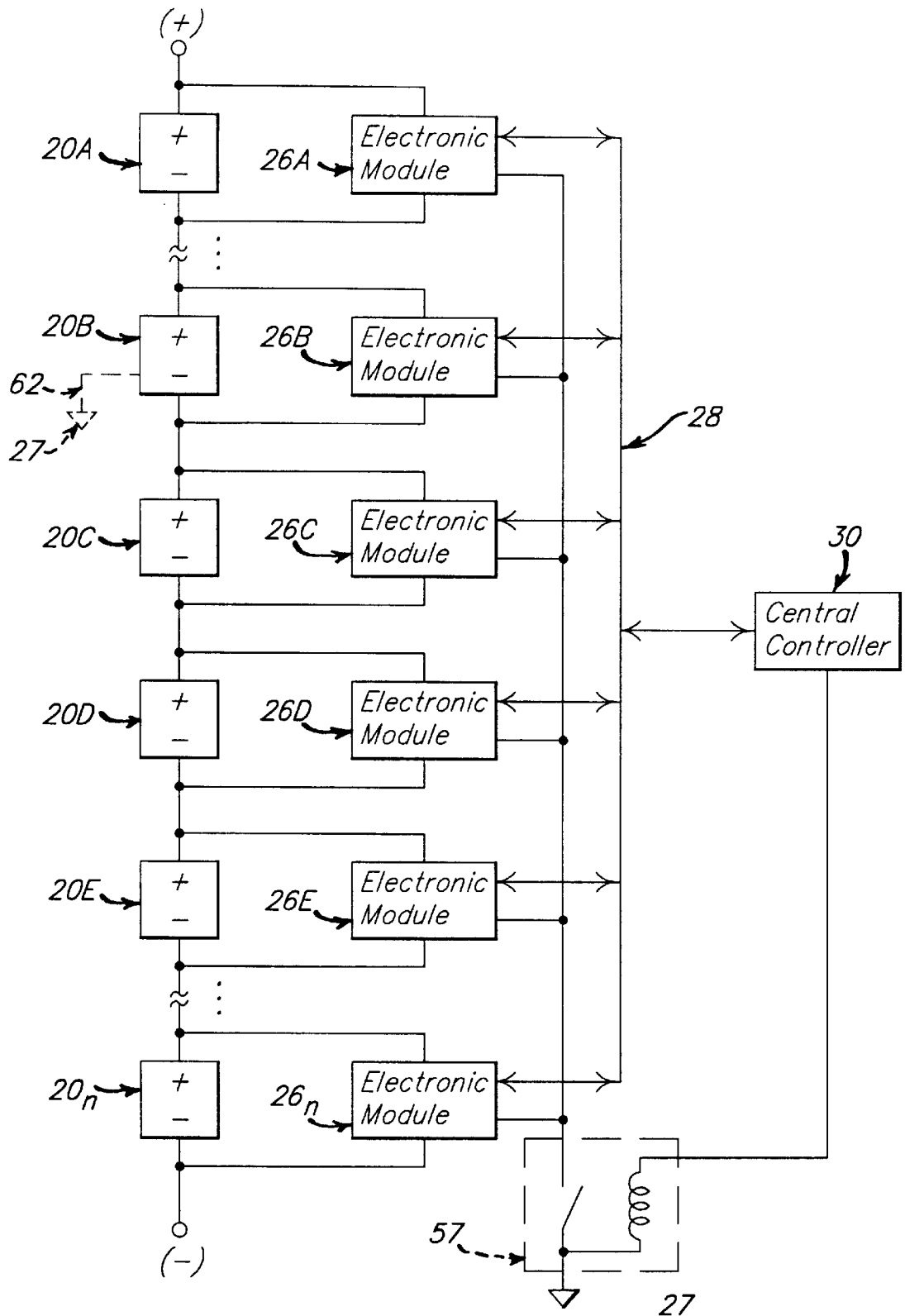
FIG. 1 illustrates a distributed electronic system according to one embodiment of the present invention.

Referring now to FIG. 1, a distributed electronic system according to one embodiment of the present invention is illustrated. The system includes a plurality of batteries 20A–20n, such as the "traction batteries" of an electric vehicle. These batteries 20A–20n provide power via terminals (+) and (−) for the electric motor (not shown) which propels the vehicle. Coupled across each battery 20A–20n is an electronic module 26A–26n. A primary function of electronic modules 26A–26n is to measure the voltages of batteries 20A–20n. Each of electronic modules 26A–26n is preferably located in close proximity to its respective battery 20A–20n. More preferably, each electronic module 26A–26n is within its respective battery 20A–20n. (From this point forward, batteries 20A–20n will each be referred to as a "battery 20" or will be referred to collectively as "batteries 20", except when it is necessary to refer to a particular battery such as "battery 20B". This convention will likewise be followed with respect to electronic modules 26A–26n.)

Batteries 20 and electronic modules 26 are included in a vehicle having a chassis ground 27. As is common in electric vehicles, batteries 20 are isolated by design from chassis ground 27. Electronic modules 26 are coupled via a data bus 28 to a central controller 30. Central controller 30 has responsibility for monitoring the voltages of batteries 20, among other responsibilities.

A voltage divider comprising resistors 34 and 36 is coupled across a battery 20. This voltage divider scales the battery voltage $V_{batt}$ appropriately for reading by A/D converter 38. Microprocessor 40 receives this digitized voltage from A/D converter 38 and reports it via data bus interface 42 and optical isolator 44 to central controller 30 on data bus 28. Electronic modules 26 can take voltage measurements on their own initiatives, for example at a predetermined periodic rate. Additionally, electronic modules 26 can take voltage measurements at the command of central controller 30 via a command on data bus 28.

Electronic module 26 also includes voltage regulator 50. Voltage regulator 50 provides a regulated voltage $V_{ref}$, preferably five volts, using $V_{batt}$ as a source. The output $V_{ref}$ of voltage regulator 50 is coupled to a voltage divider comprising resistors 52 and 54. The output node 56 of this voltage divider is provided for voltage measurement by A/D converter 38. Note that A/D converter 38 measures the voltage of output node 56 with respect to the negative terminal of the battery 20 to which electronic module 26 is coupled.

A relay 55 is provided to switchably couple output node 56 via resistor 58 and through terminal 60 to chassis ground 27. One function of this switchable connection is to detect a conductivity leakage path (for example, conductivity leakage path 62) from a battery 20 to chassis ground 27. This conductivity leakage path detection is performed with relay 57 (FIG. 1) closed. Assuming that resistors 52 and 54 are of equal resistance (a preferable situation), the voltage as measured by A/D converter 38 at node 56 with relay 55 open will be 2.5 volts.

Figure 2:
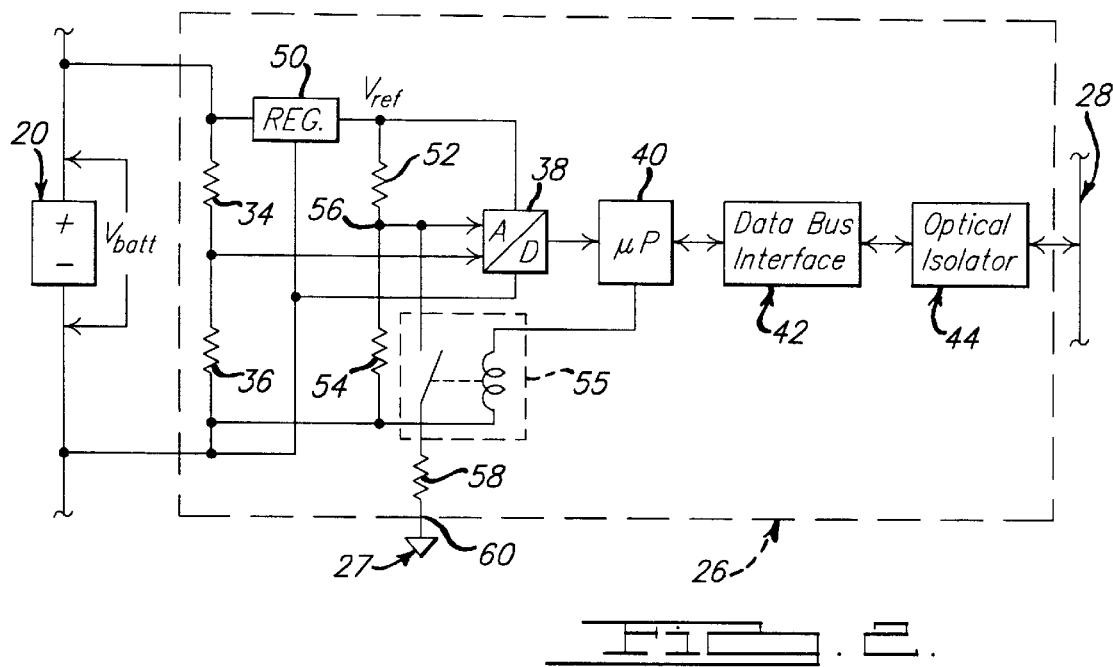
FIG. 2 illustrates an electronic module 26 of FIG. 1.

The system illustrated in FIGS. 1 and 2 and the operation of the system as heretofore described are discussed in more detail in my copending U.S. Pat. No. 5,760,587, filed Jun. 28, 1995. If more detail is desired than has been heretofore provided, the reader is referred to that application, the entire disclosure of which is hereby incorporated by reference.

In a distributed system such as that in FIG. 1, it is important for central controller 30 to be able to distinguish between modules 26 as the source of data being received by central controller 30 via data bus 28. Also, central controller 30 may wish to distinguish among modules 26 if central controller 30 wishes to send an individual command to one of modules 26 (for example, to command that a voltage measurement be taken by one module 26). Thus an addressing scheme is desirable in which each of modules 26 has a unique address.

An effective method for assigning addresses according to one embodiment of the present invention will now be described. The method is designed for any number of electronic modules 26, without central controller 30 having a priori knowledge of the number of electronic modules 26. In this embodiment of the present invention, the method illustrated is appropriate for a system having up to 127 modules 26, with those modules having seven-bit addresses.

The addressing method begins with central controller 30 opening relay 57. This eliminates any potential interference in the address-assigning process from a leakage path 62 which might exist. Relay 57 remains open for the entire address-assigning process hereinafter described.

The addressing method continues with central controller 30 commanding, via data bus 28, every module 26 to set its address (stored within each module 26's memory) to zero. This can be done via an "all modules" global command, so the fact that modules 26 do not yet have assigned addresses is not an impediment. This "all modules" global command can be sent to address 127, with all modules 26 programmed to be responsive to this address. Next, central controller 30 commands every module 26 to close its relay 55. Next, central controller 30 commands every module 26 to read the voltage, as measured by its A/D converter 38, at its voltage divider output node 56.

Figure 3:
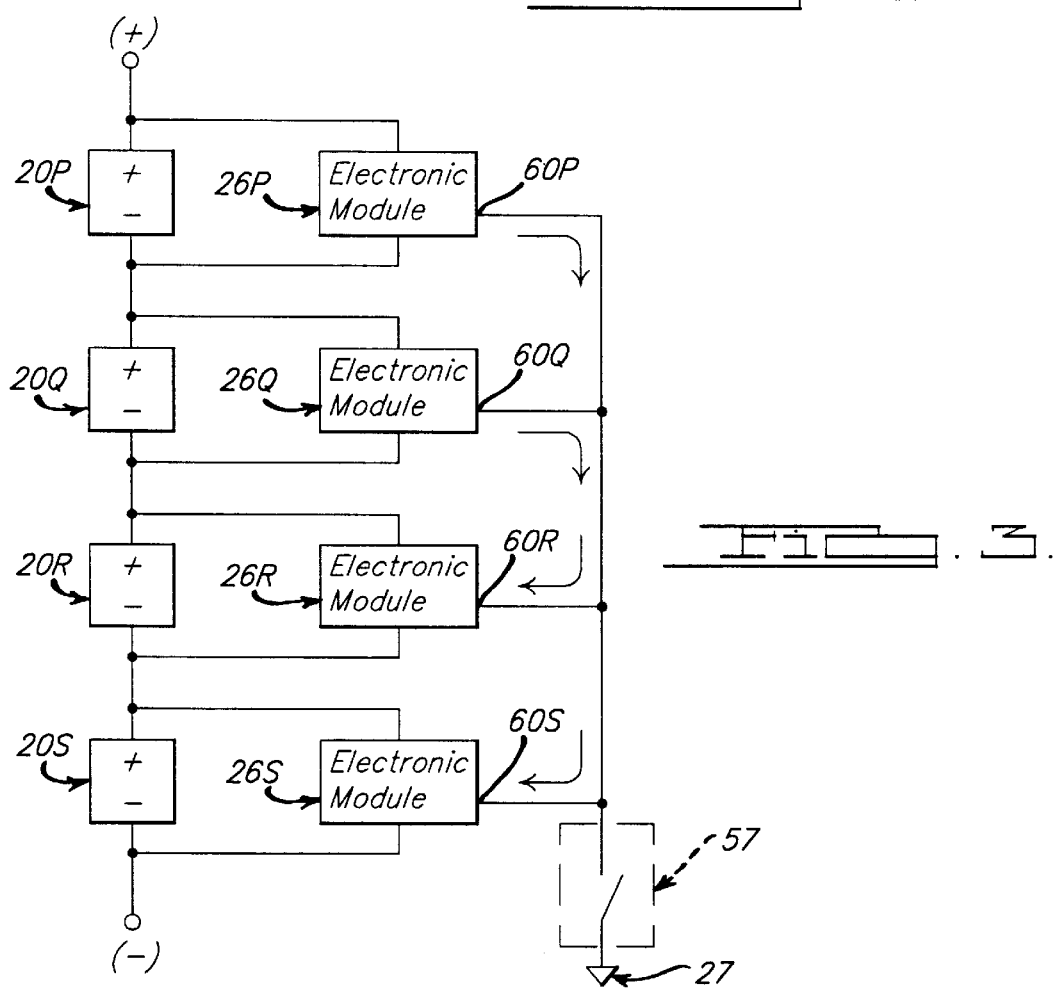
FIG. 3 illustrates electrical currents which flow during a portion of a process for assigning addresses in a system containing electronic modules 26P–26S.

Recall that with relays 55 open, each voltage divider output 56 will be measured at 2.5 volts by its respective A/D converter 38. Now, with all relays 55 closed, about half of the voltages should be above 2.5 volts and about half should be below 2.5 volts. This can be explained with additional reference to FIG. 3. FIG. 3 shows a simple system having only four modules 26. With all relays 55 of those modules closed, their voltage divider output nodes 56 are all coupled together via their resistors 58. Those modules coupled to batteries 20 in higher positions in the battery pack will have voltage divider output nodes 56 at higher potential than the voltage divider nodes 56 in modules 26 coupled to batteries 20 in lower positions (we are speaking here about higher potential in absolute terms, not the local voltages measured by the respective A/D converters 38). Thus, with relays 55 closed, modules 26 in higher positions (such as modules 26P and 26Q) will source current to modules 26 in lower positions (such as modules 26R and 26S). Arrows in FIG. 3 show current being sourced by modules 26P and 26Q out of terminals 60P and 60Q and current being sunk by modules 26R and 26S at terminals 60R and 60S.

A module 26 which sources current will do so through its resistor 52. Thus, the voltage at its voltage divider output node 56 (as locally measured by its A/D converter 38) will drop. Conversely, a module which sinks current will do so through its resistor 54. Thus, the voltage at its voltage divider output node 56 (again, as measured by its A/D converter 38) will rise. Therefore, modules 26 which are higher in the battery pack will have their voltages, as locally measured by their A/D converters 38, drop when relays 55 are closed. (Actually, the higher that one of these modules 26 is in the battery pack, the more its voltage will drop, because the module will source more current.) Those modules 26 which are lower in the battery pack will have their voltages rise. (The lower that one of these modules 26 is in the battery pack, the more its voltage will rise.)

It should be noted that while voltage divider output nodes 56 are coupled together via resistors 58 in this embodiment of the present invention, resistors 58 can be omitted. That is, voltage divider output nodes 56 can be directly coupled via relays 55. Resistors 58 are included for the conductivity leakage detection function which was briefly mentioned above and which is described in more detail in my co-pending patent application Ser. No. 08/496,637.

Central controller 30 now sends commands to all modules 26 that if their voltages as locally measured by their respective A/D converters 38 are below 2.5 volts, they should change their addresses from zero to 126. Recall that these modules 26 would be the ones coupled to batteries 20 higher in the battery pack, as viewed in FIG. 1. The remainder of the modules 26 are left with an address of zero. (That is, those modules 26 are assigned the same address they already had.) Modules 26 are thus divided into two groups, one group containing modules 26 with an address of 126 and one group containing modules 26 with an address of zero. (Note that modules 26 can be divided into more than two groups, for example by selecting two voltage thresholds which will divide modules 26 into three groups. In this embodiment of the present invention, however, modules 26 are divided into only two groups.)

Central controller 30 now embarks on a second "pass" at dividing modules 26 into yet more groups. (Relay 57 remains open.) First, central controller 30 sends a command to all modules 26 having an address of 126 to close their relays 55 and all modules 26 having an address of zero to open their relays 55. Next, central controller 30 sends a command to all modules 26 having an address of 126 to take a local voltage measurement at voltage divider output node 56. Half of the voltage measurements would be expected to be below 2.5 volts (those measurements taken by modules in the upper half of the group of modules having an address of 126) and half below (those modules in the lower half of the group of modules having an address of 126).

Central controller 30 will thus send a command to all modules 26 with an address of 126 that if their voltage measurements were above 2.5 volts, they should change their addresses from 126 to 63. These modules 26 have been determined to be the lowermost modules having an address of 126. The remainder of modules 26 with an address of 126 will retain that address.

The second "pass" continues with central controller 30 commanding all modules 26 with an address of zero to close their relays 55 and all modules with other addresses to open their relays 55. Next, central controller 30 sends a command to all modules 26 having an address of zero to take a local voltage measurement at voltage divider output node 56. Half of the voltage measurements would be expected to be below 2.5 volts (those measurements taken by modules in the upper half of the group of modules having an address of zero) and half below (those modules in the lower half of the group of modules having an address of zero).

Central controller 30 will thus send a command to all modules 26 with an address of zero that if their voltage measurements were below 2.5 volts, they should change their addresses from zero to 62. These modules 26 have been determined to be the uppermost of modules 26 having an address of zero. The remainder of modules 26 with an address of zero will retain that address.

After the second "pass", all modules 26 will have an address of either 0, 62, 63 or 126. The modules 26 with an address of 126 will be the uppermost modules 26 in the battery pack, followed by 63, 62 and zero.

Five more "passes" are performed by central controller 30. For a system accommodating up to 127 batteries 20, seven "passes" will guarantee that all resultant groups of modules 26 will have exactly one module 26. That is, each modules 26 will have a unique address, the addresses assigned to modules 26 in decreasing order from top to bottom along the series connection of batteries 20. If during any of the "passes" a group of modules 26 already has exactly one module 26, the present process of course divides that group no further.

For a system having less than 65 batteries 20, seven "passes" will not be necessary. For example, for two batteries 20, only one "pass" is needed to assign unique addresses to each of the two modules 26. For seven batteries 20, only three "passes" are needed. Thus, if central controller 30 knows a priori how many batteries 20 (and therefore modules 26) are in the system, less than seven "passes" will be required to assign each module 26 a unique address. Further, in a variation of the present invention which was discussed above, each "pass" can divide each group of modules 26 into more than two groups. This would also reduce the number of "passes" required.

Table 1 shows, for an eight-battery system, the addresses which might be assigned at the various "passes". Newly-assigned addresses at each "pass" are underlined.

TABLE 1

| First "pass" | Second "pass" | Third "pass" |
|---|---|---|
| 126 | 126 | 126 |
| 0 | 63 | 95 |
|  | 62 | 94 |
|  | 0 | 63 |
|  |  | 62 |
|  |  | 32 |
|  |  | 31 |
|  |  | 0 |

Table 2 shows, for a 13-battery system, the addresses which might be assigned at the various "passes". Newly-assigned addresses at each "pass" are underlined.

TABLE 2

| First "pass" | Second "pass" | Third "pass" | Fourth "pass"* |
|---|---|---|---|
| 126 | 126 | 126 | 126 |
| 0 | 63 | 95 | 111 |
|  | 62 | 94 | 110 |
|  | 0 | 63 | 95 |
|  |  | 62 | 94 |
|  |  | 32 | 79 |
|  |  | 31 | 78 |
|  |  | 0 | 63 |
|  |  |  | 62 |
|  |  |  | 48 |
|  |  |  | 47 |
|  |  |  | 32 |
|  |  |  | 31 |
|  |  |  | 16 |
|  |  |  | 15 |
|  |  |  | 0 |

*Note: in a 13-battery system, only 13 of these 16 addresses will be assigned at the fourth "pass". Three of the groups of modules 26 will already contain exactly one member after the third "pass".

Table 2

It can be appreciated that the addressing method described herein assigns addresses to modules 26 based on the potentials of their voltage divider output nodes 56. That is, a first module 26 which is higher in the battery pack (i.e., closer to the (+) terminal of the battery pack) will have its voltage divider output node 56 at a higher potential than a second module 26 which is lower in the battery pack. "Potential" here is used to denote absolute potential within the battery pack, as opposed to local voltage at nodes 56 measured within modules 26 by the respective A/D converters 38. As has been described, the potentials of output nodes 56 are compared by closing relays 55 and examining the resultant local voltage measurements at nodes 56.

Once all "passes" have been performed, each module 26 will have a unique address. However, if less than 127 batteries 20 (and therefore modules 26) are in the system, the addresses will be discontinuous. For example, in a four-battery system, the addresses of modules 26 will be 126, 63, 62 and zero. For further examples, see Table 1 and Table 2 above. For the convenience of a service technician who may need to service the vehicle in the future, central controller 30 can re-assign addresses to modules 26 such that the addresses are consecutive. For example, in the four-battery system, the modules 26 could be re-assigned the addresses 4, 3, 2 and 1. These new addresses will have better correspondence with the labelling of modules 26 in a service manual for the vehicle.

Central controller 30 can re-assign addresses to modules 26 by polling every possible address, zero through 126, and listening for a response. Once central controller 30 knows all of the addresses which have been assigned to modules 26, central controller 30 can individually command each module 26 to change its address such that all addresses are continuous. Once final addresses have been assigned to modules 26, each module preferably retains its address in non-volatile memory such as EEPROM, so the addresses need not be assigned again.

Various other modifications and variations will no doubt occur to those skilled in the arts to which this invention pertains. Such variations which generally rely on the teachings through which this disclosure has advanced the art are properly considered within the scope of this invention. This disclosure should thus be considered illustrative, not limiting, the scope of the invention is instead defined by the following claims.

What is claimed is:

1. A method for identifying a plurality of electronic modules, each said electronic module having inputs coupled between positive and negative terminals of one of a series-connected plurality of batteries, said method comprising:

(a) including a current-dependent voltage source within each electronic module, each said voltage source having an output;
   (b) simultaneously switchably coupling each said voltage source output to a common node and measuring a voltage at each said voltage source output;
   (c) segregating said plurality of electronic modules into at least two groups, said groups defined by said measured voltages; and
   (d) assigning a common address to all electronic modules within each group.

2. A method as recited in claim 1, wherein:
   in said step (b), said each voltage source output is simultaneously coupled to said common node via a resistance.

3. A method as recited in claim 1, wherein said current-dependent voltage sources are voltage dividers.

4. A method as recited in claim 1, further comprising:
   repeating steps (b) through (d) for each group of electronic modules until all resulting groups have exactly one of said plurality of electronic modules.

5. A distributed electronic system comprising:

a plurality of batteries coupled in series;
   a plurality of electronic modules, each electronic module coupled across a said battery;
   wherein each said electronic module further comprises means for providing a voltage at a measurement node within that electronic module; means for switchably and simultaneously coupling the measurement node in that electronic module to a common point; and means in electrical communication with the measurement node in that electronic module for measuring a voltage at the measurement node in that electronic module; and
   means in electrical communication with said plurality of electronic modules for segregating a subset of said plurality of electronic modules into at least two groups, each group defined by voltages measured by said measuring means within said subset of electronic modules when said switchable and simultaneous coupling means within said subset of electronic modules simultaneously and switchably couple said measurement nodes of said subset of electronic modules to said common point.

6. A system as recited in claim 5, wherein:
   said measuring means measures the voltage of each measurement node with reference to the battery to which the electronic module containing that measurement node is coupled.

7. A system as recited in claim 6, wherein:
   said groups include a first group and a second group, each electronic module in said first group having a voltage at its said measurement node greater with all said measurement nodes of said subset of electronic modules coupled together than without said measurement nodes of said subset of electronic modules coupled together, and each said electronic module in said second group having a voltage at its said measurement node less with all said measurement nodes of said subset of electronic modules coupled together than without said measurement nodes of said subset of electronic modules coupled together.

8. A system as recited in claim 7, wherein said means for switchably and simultaneously coupling each said measurement node to a common point switchably couples each measurement node to said common point via a resistance.

* * * * *